Figure 1:
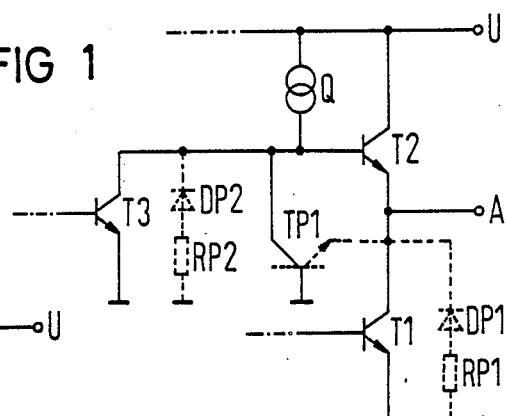

United States Patent [19]

Lenz et al.

[11] Patent Number: 4,949,212
[45] Date of Patent: Aug. 14, 1990

[54] CIRCUIT CONFIGURATION FOR PROTECTING AN INTEGRATED CIRCUIT

[75] Inventors: Michael Lenz, Zorneding; Frank-Lothar Schwertlein, Munich; Wolfgang Horchler, Haar, all of Fed. Rep. of Germany

[73] Assignee: Siemens Aktiengesellschaft, Munich, Fed. Rep. of Germany

[21] Appl. No.: 311,176

[22] Filed: Feb. 15, 1989

[30] Foreign Application Priority Data

Feb. 15, 1988 [DE] Fed. Rep. of Germany ....... 3804726

[51] Int. Cl.⁵ .............................................. H02H 9/04
[52] U.S. Cl. ......................................... 361/56; 361/58; 361/91; 361/111; 357/23.13
[58] Field of Search ..................... 361/56, 58, 91, 111; 357/23.13

[56] References Cited

U.S. PATENT DOCUMENTS 4,775,912 10/1988 Menniti et al. ..................... 361/56

OTHER PUBLICATIONS

German brochure: Thomas M. Frederiksen, "Schwierigkeiten und ihre Behebung beim Anwenden integrierter Operationsuerstärker", Elektronike, No. 6/1985, pp. 42–63; p. 43 pertinent.

Primary Examiner—Todd E. DeBoer
Attorney, Agent, or Firm—Herbert L. Lerner; Laurence A. Greenberg

[57] ABSTRACT

A circuit configuration for protecting an integrated circuit from damage by a voltage present at an output exceeding the supply voltage range of the integrated circuit includes a given number of parasitic circuit structures of the integrated circuit. Additional circuit structures combined with the parasitic circuit structures form a protective circuit. The circuit structures are activated by the voltage at the output to become operative for protection.

8 Claims, 1 Drawing Sheet

CIRCUIT CONFIGURATION FOR PROTECTING AN INTEGRATED CIRCUIT

The invention relates to a circuit configuration for protecting an integrated circuit from damage by a voltage present at an output exceeding the supply voltage range of the integrated circuit, including parasitic circuit structures.

If voltages that are outside the supply voltage range of an integrated circuit appear at the output of the integrated circuit, as may happen during operation with inductive loads, for instance, then internal parasitic circuit structures are activated. For example, p-n junctions between a p-doped substrate and a plurality of n-doped wells are formed, which produce parasitic diode and transistor structures in the flow direction during operation. Current is drawn from each n-doped well, which in certain cases leads to functional malfunctions of individual circuit structures and damages the integrated circuit.

It is known to protect the outputs of integrated circuits from impermissible voltages by means of free-running or recovery diodes. To do so, as a rule diodes are connected in the blocking direction from both supply voltages to the output of the integrated circuit. In order to limit the incident substrate currents, a resistor must be connected between the output and the load, or else the free-running or recovery diodes must be constructed as Schottky diodes. Furthermore, it is possible to protect an output by means of two Zener diodes with suitable breakdown voltages which are connected opposite one another In these cases, however, the necessity of an additional, external expense for circuitry is a disadvantage. Integrating the free-running or recovery diodes is of little use, because of the formation of further parasitic circuit structures that this involves.

As is known for instance from "Schwierigkeiten und ihre Behebung beim Anwenden integrierter Operationsverstärker" [Problems and their Solutions in the use of Integrated Operational Amplifiers], Elektroniker [Electronic Engineer] No. 6, 1985, page 43 et seq., these parasitic components can be utilized in constructing the circuit of an operational amplifier. In this case, the parasitic components are intentionally integrated, and the switching circuits are laid out accordingly. However, improper operation can activate parasitic components which are not expected to be present. In such a case, events can take place which lead to damage of the circuit.

It is accordingly an object of the invention to provide a circuit configuration for protecting an integrated circuit, which overcomes the hereinafore-mentioned disadvantages of the heretofore-known devices of this general type and which protects an integrated circuit from the consequences of a voltage present at the output thereof that exceeds the supply range of the integrated circuit, while reducing the external circuitry expense in particular, and lessening the influence of unavoidable parasitic circuit structures that impair the function of the integrated circuit.

With the foregoing and other objects in view there is provided, in accordance with the invention, a circuit configuration for protecting an integrated circuit from damage by a voltage present at an output exceeding the supply voltage range of the integrated circuit, comprising a given number of parasitic circuit structures of the integrated circuit, and additional circuit structures combined with the parasitic circuit structures forming a protective circuit, the circuit structures being activated by the voltage at the output to become operative for protection.

In accordance with another feature of the invention, there are provided parasitic protective transistor structures formed by a given number of circuit structures in combination with at least one parasitic diode structure.

In accordance with a further feature of the invention, the circuit structures form lateral parasitic circuit structures.

In accordance with an added feature of the invention, the collector-to-emitter path of a parasitic protective transistor structure is connected in parallel with the base-to-emitter path of a given transistor structure.

In accordance with an additional feature of the invention, a parasitic protective transistor structure triggers another given circuit structure.

In accordance with yet another feature of the invention, there is provided a diode structure additionally integrated into the circuit and connected in the blocking direction between the output and a positive supply potential.

In accordance with yet a further feature of the invention, there is provided a diode structure additionally integrated into the circuit and connected in the blocking direction between a negative operating potential and the output.

In accordance with a concomitant feature of the invention, there is provided a diode structure additionally integrated into the circuit and connected in the blocking direction between the output and ground.

The invention has the advantage of eliminating the necessity of providing external protection and the associated expense for external circuitry. The functionally damaging influence of unavoidable parasitic circuit structures is kept to a minimum, because these structures, along with additional circuit structures introduced as further elements, can also be included in the protective measures Other features which are considered as characteristic for the invention are set forth in the appended claims Although the invention is illustrated and described herein as constructed in a circuit configuration for protecting an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional obJects and advantages thereof will be best understood from the following description of specific embodiments when read in connection with the accompanying drawings.

Figure 2:
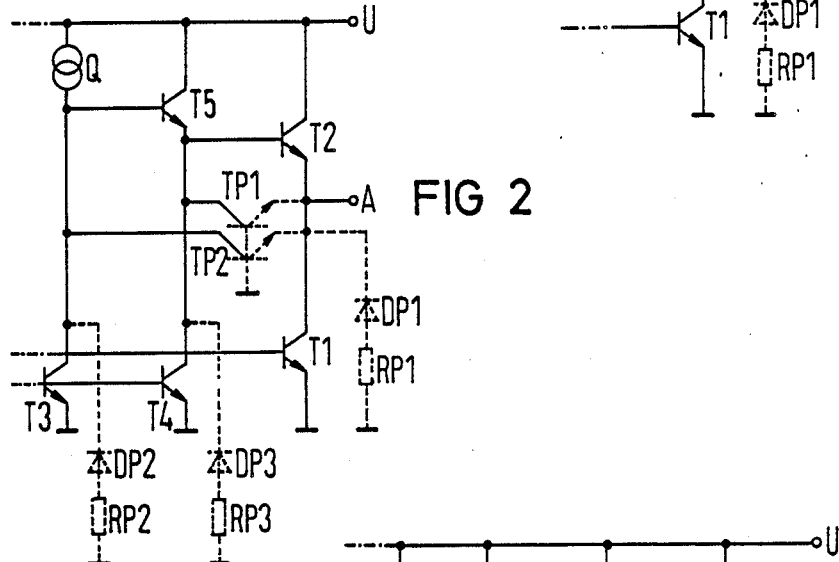
Figure 3:
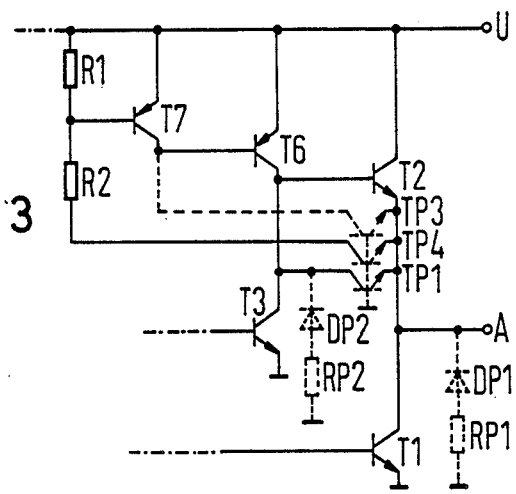

FIG. 1 is a schematic circuit diagram of a first embodiment of a circuit configuration according to the invention FIG. 2 is a circuit diagram of a second embodiment of a circuit configuration according to the invention; and FIG. 3 is a circuit diagram of a third embodiment of a circuit configuration according to the invention.

Referring now to the figures of the drawing in detail and first, particularly, to FIG. 1 thereof, there is seen a basic circuit diagram of a form of output stage that is customary in integrated circuits. The output stage is substantially constructed of a quasi-complementary push-pull end stage being formed of two n-p-n transistor structures T1 and T2. The collector of the transistor structure T2 is connected to a positive operating potential U, and the emitter of the transistor structure T1 is connected to a negative operating potential, which in this case is ground The base of the transistor structure T2 is first fed from a current source Q which is connected to the positive operating potential and second is carried to ground by means of an n-p-n transistor structure T3 which is operated as an emitter circuit An output A is defined by a connection between the transistor structures T1 and T2. The base of the transistor structure T1 and the base of the transistor structure T3 are respectively connected to further circuit elements, which are not of particular interest in the present case and therefore have not been shown. Besides these just-described circuit structures which are intentionally provided, unintentional parasitic structures also initially arise. In order to better distinguishing them in the drawing, the intended structures are shown in solid lines and the parasitic structures are shown in broken lines. The transistor structures T1 and T3 each have an emitter connected to ground and each substantially have a parasitic circuit structure that appears between the substrate and the collector thereof. The parasitic structures are formed of a series circuit of a respective ohmic resistor RP1, RP2 and a respective diode DP1, DP2 disposed in the blocking direction. A parasitic lateral transistor structure TP1 is created from the parasitic structure having the diode DP1 and the resistor Rp1 disposed between the output A and ground, by introducing an additional n-doped well. The base of the parasitic lateral structure TP1 is connected to ground and the emitter thereof is connected to the potential of the output A. The collector of the parasitic lateral structure TP1 is connected to the base of the transistor structure T2.

The exemplary embodiment shown in FIG. 2 of the drawing is based on that of FIG. 1 and has been expanded by comparison with FIG. 1 through the addition of a trigger circuit for the n stage, which is constructed as a Darlington circuit. To this end, the base line of the transistor structure T2 is cut and a transistor structure T5 is inserted in such a way that the emitter of the transistor structure T5 is connected to the base of the transistor structure T2 and the collector of the transistor structure T5 is connected to the collector of the transistor structure T2. The base of the transistor structure T5, like the base of the transistor structure T2 in FIG. 1, is connected to the transistor structure T3 and to the current source Q. Furthermore, the emitter of the transistor structure T5 is joined to the collector of a transistor structure T4, the base-to-emitter path of which is parallel to that of the transistor structure T3. An additional parasitic circuit structure which results in a resistor-diode structure RP3, DP3 between ground and the collector of the transistor structure T4, as well as a lateral transistor structure TP2 derived from the diode structure DP1 by the addition of an additional n-doped well. The collector of the parasitic lateral transistor structure TP2 is connected to the collector of the transistor structure T3.

The exemplary embodiment shown in FIG. 1 is modified in FIG. 3 in such a way that the current source Q is replaced by a p-n-p transistor structure T6 which has an emitter connected to the positive operative operating voltage U and a collector joined with the base of the transistor structure T2. The collector-to-emitter path of a further p-n-p transistor structure T7 connects the base of the transistor structure T6 to the positive operating potential. The base of the transistor structure T7 is connected to the tap of a voltage divider R1, R2, which has a resistor R1 connected to the positive operating potential U and a resistor R2 connected to the collector of a lateral parasitic transistor structure TP4. The lateral parasitic transistor structure TP4 in turn is derived from the diode structure DP1, by the introduction of an additional n-doped well. The diode structure DP1 is moreover in interaction with an n-doped well functioning as the base of the transistor structure T6 and thus forms a parasitic transistor structure TP3.

Since the basic construction of the circuit configuration shown in the drawing has been explained, the mode of operation of the circuit configuration will be described in further detail.

By switching off an inductive load, for example, a potential that is negative with respect to ground appears at the output A. As a result, the parasitic diode-resistor structure DP1, RP1 derived from the transistor structure T1 and the diode-resistor structure DP2, RP2 derived from the transistor structure T3, are activated. However, this means that the base of the transistor structure T2 is connected to ground through the parasitic diode-resistor structure DP2, RP2, and the emitter thereof is connected to a potential that is negative with respect to ground, which causes the transistor structure T2 to be conductive. In this case it is not possible to prevent the allowable base-to-emitter voltage nor the allowable emitter-to-collector current from being exceeded for the transistor structure T2. By incorporating one or more n-doped wells, parasitic lateral transistor structures TP1, TP2, TP4 are created in combination with the parasitic diode structure DP1, and since these transistor structures are already partially present and are only activated in the event of a malfunction, they are advantageously used according to a further feature of the invention as controlling elements for protecting threatened circuit elements. Lateral parasitic transistor structures are particularly advantageous in this case, because they have higher breakdown voltages and lower capacitances and they require less space than other structures. A simple and therefore advantageous use of parasitic transistor structures is to short-circuit the base-to-emitter path of a given transistor structure T2, T5 by connecting the collector-to-emitter path of the parasitic lateral protective transistor structure TP1, TP2 in parallel with the base-to-emitter path of the given transistor structure T2, T5. Since the base of the parasitic transistor structure TP1 is connected to ground and the emitter is connected to the output potential, if the potential at the output is negative, the transistor is made conductive, and thus blocks the transistor structure T2.

In the same manner, the Darlington transistor shown in FIG. 2, which is formed of the transistor structures T5 and T2, is short-circuited by the parasitic lateral transistor structure TP2 connected between the base and the emitter.

If there is a complementary Darlington transistor, which includes the transistor structures T2 and T6 as shown in FIG. 3, then it is advantageous according to another feature of the invention, to use a parasitic lateral transistor structure TP4 for triggering an auxiliary circuit. If there is a negative potential present at the output A, the parasitic lateral transistor structure TP3 opens, causing current to be drawn from the base zone of the transistor structure T6. In order not to make the transistor structure T6 conductive, the additional transistor structure T7 is inserted between the base and emitter of the transistor structure T6 and becomes conductive by means of the parasitic transistor structure TP4 for short-circuiting the base-to-emitter path of the transistor structure T6. The resistor R1 in this case serves to increase the resistance to malfunctioning and the resistor R2 serves to limit current.

Finally, it should also be noted that it is possible to integrate additional diode structures into a given circuit structure D2. For example, a diode structure may be connected in the blocking direction between the output and the positive supply potential, or a lateral diode structure D1 between the negative operating potential and the output, or between the output and ground. The advantage of such a structure is to produce an increased protective action, particularly at high free-running current. The resultant parasitic circuit structures are suitably used as further controlling elements in combination with a protective circuit.

We claim:

1. Circuit configuration for protecting an integrated circuit from damage by a voltage present at an output exceeding the supply voltage range of the integrated circuit, comprising a given number of parasitic circuit structures of the integrated circuit, including parasitic lateral protective npn-transistor structures, wherein a collector-emitter path of said parasitic lateral protective npn-transistor structures is connected in parallel with a given npn-transistor structure of the integrated circuit, said parasitic lateral protective npn-transistor structures being activated by the voltage at the output exceeding the supply voltage range.

2. Circuit configuration according to claim 1, including parasitic protective transistor structures formed by a given number of circuit structures in combination with at least one parasitic diode structure.

3. Circuit configuration according to claim 1, wherein said circuit structures form lateral parasitic circuit structures.

4. Circuit configuration according to claim 1, wherein the collector-to-emitter path of a parasitic protective transistor structure is connected in parallel with the base-to-emitter path of a given transistor structure.

5. Circuit configuration according to claim 1, wherein a parasitic protective transistor structure triggers another given circuit structure.

6. Circuit configuration according to claim 1, including a diode structure additionally integrated into the circuit and connected in the blocking direction between the output and a positive supply potential.

7. Circuit configuration according to claim 1, including a diode structure additionally integrated into the circuit and connected in the blocking direction between a negative operating potential and the output.

8. Circuit configuration according to claim 1, including a diode structure additionally integrated into the circuit and connected in the blocking direction between the output and ground.

* * * * *